United States Patent
Tsironis

(10) Patent No.: US 10,591,571 B1
(45) Date of Patent: Mar. 17, 2020

(54) ADJUSTABLE PRE-MATCHING COAXIAL TRANSISTOR TEST FIXTURE

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 259 days.

(21) Appl. No.: 15/847,366

(22) Filed: Dec. 19, 2017

Related U.S. Application Data

(60) Provisional application No. 62/436,132, filed on Dec. 19, 2016.

(51) Int. Cl.
*G01R 35/00* (2006.01)
*G01R 31/26* (2020.01)

(52) U.S. Cl.
CPC ....... *G01R 35/005* (2013.01); *G01R 31/2601* (2013.01)

(58) Field of Classification Search
CPC .............. G01R 35/005; G01R 31/2601; G01R 31/2822; G01R 27/28; G01R 27/32; G01R 31/2612; G01R 31/2837; G01R 35/00; G01R 1/07; G01R 27/04; G01R 31/2614; G01R 31/2839; H03H 7/40; H03H 7/38; H03H 11/28
See application file for complete search history.

(56) References Cited

U.S. PATENT DOCUMENTS 3,417,350 A * 12/1968 Cruz .................... H03J 1/08
                                                   333/35
6,414,563 B1    7/2002 Tsironis

FOREIGN PATENT DOCUMENTS

GB          827021 A *  1/1960  ............... H01P 5/04

OTHER PUBLICATIONS

Ghannouchi, Load-Pull Techniques with Applications to Power Amplifier Design, Chapter 5, pp. 124-130, Springer, 2013 (Year: 2013).*
Milovanovic et al., Calculation of Characteristic Impedance of Eccentric Rectangular Coaxial Lines, Przeglad Elektrotechniczny 88(10a):260-264, 2012 (Year: 2012).*
"Test Fixture for Medium and High Power RF Transistors", Product Note 7, Focus Microwaves, Jan. 1994.
"Load Pull", [online], Wikipedia [Retrieved on Nov. 18, 2016] Retrieved from Internet <URL: http://en.wikipedia.org/wiki/Load_pull>.
"GaN RF Power Transistor" QPD2795 Data sheet, [online], Triquint/Qorvo, [Retrieved on Dec. 7, 2016] Retrieved from Internet ,URL: http://www.qorvo.com/products/p/QPD2795>.
"EEsof EDA Advanced System Designs" Brochure 5988-3326EN, Keysight Technologies, Dec. 30, 2014.

* cited by examiner

*Primary Examiner* — Daniel R Miller

(57) ABSTRACT

Coaxial microwave transistor test fixtures provide lowest insertion loss possible and include, as part of the input and output sections, transformer networks either in form of single stage λ/4 segments, or, for larger bandwidth, multiple step transforming segments from 50Ω to the impedance closer to the internal impedance of the power transistor. The transforming networks are flat or elliptical and can be rotated around the axis of the center conductor and allow adjusting the characteristic impedance of the pre-matching section by a typical ratio of up to 2.3:1, resulting in a DUT presented Max to Min impedance transforming ratio of over 5:1.

6 Claims, 15 Drawing Sheets

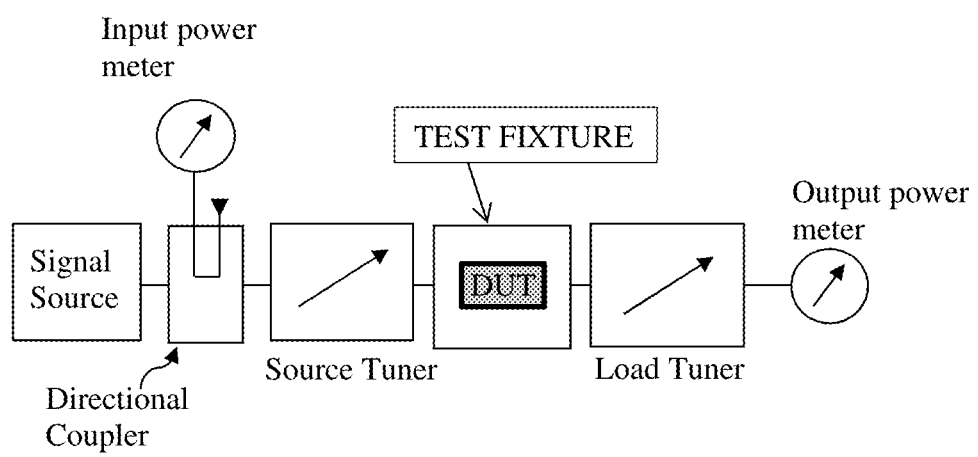
FIG. 1: Prior art

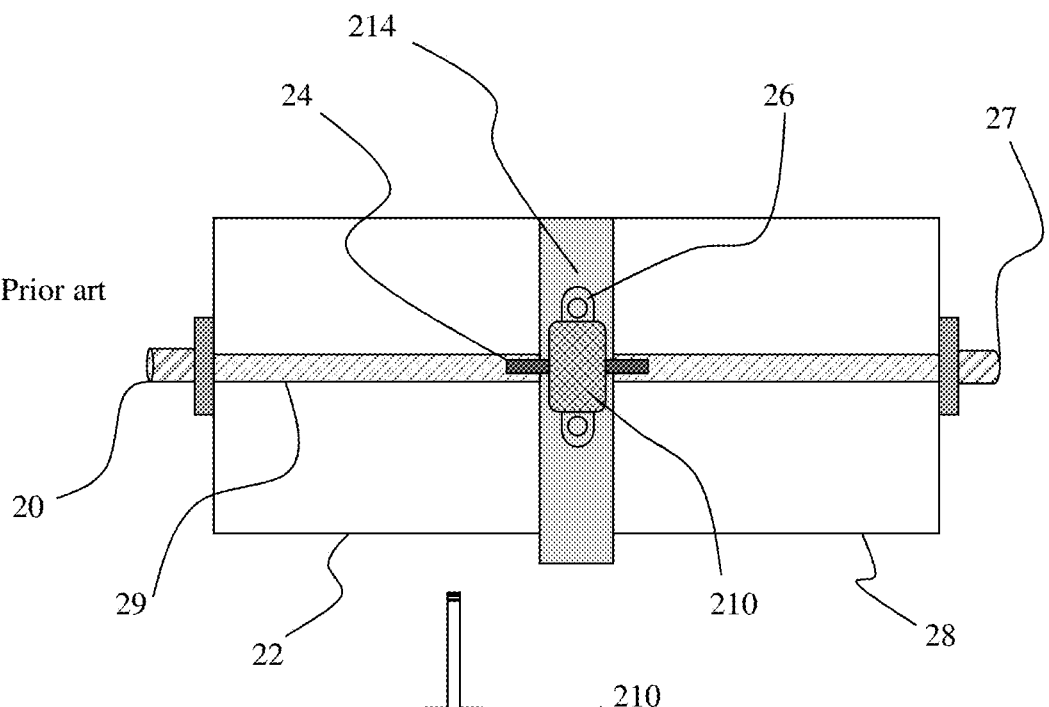
FIG. 2A: Prior art
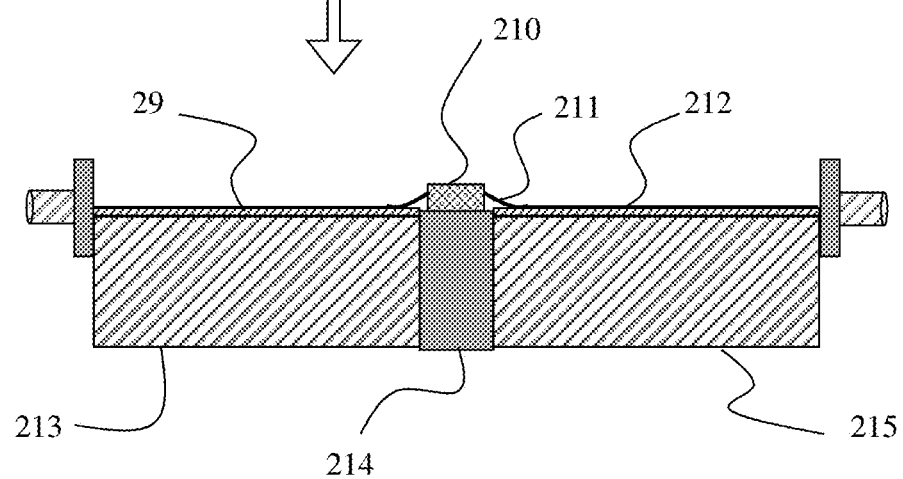
FIG. 2B: Prior art

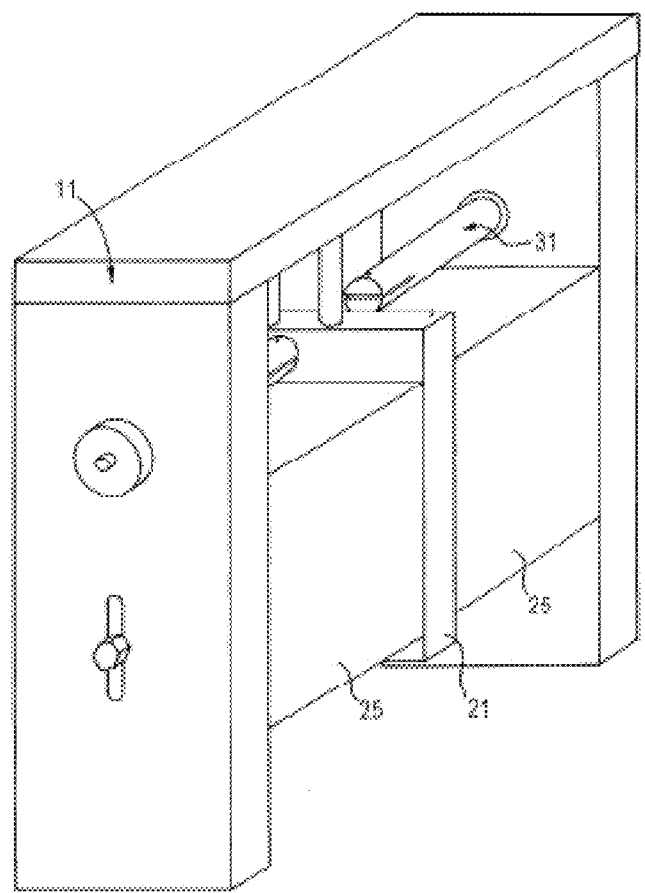
FIG. 3: Prior art

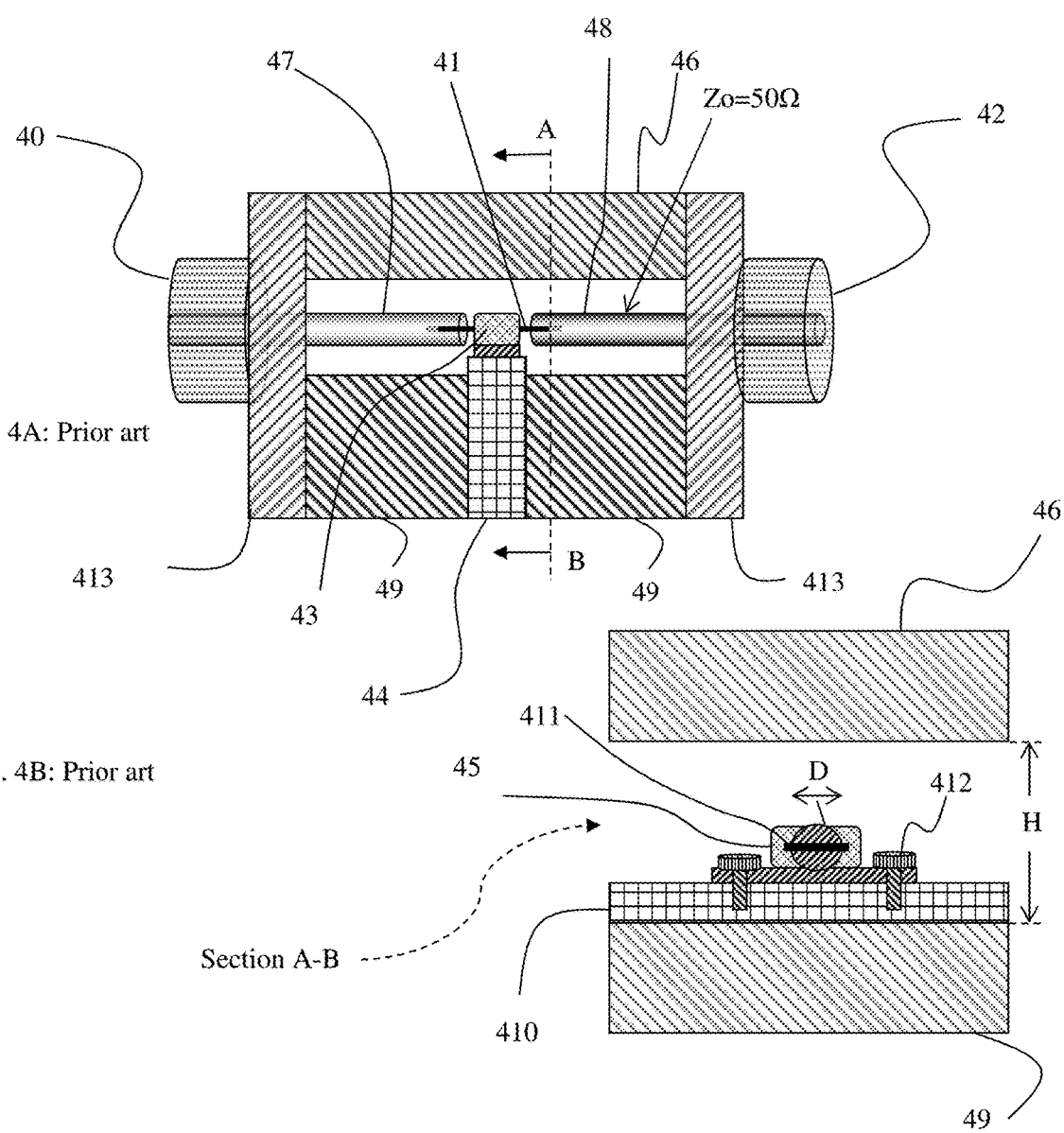
FIG. 4A: Prior art
FIG. 4B: Prior art

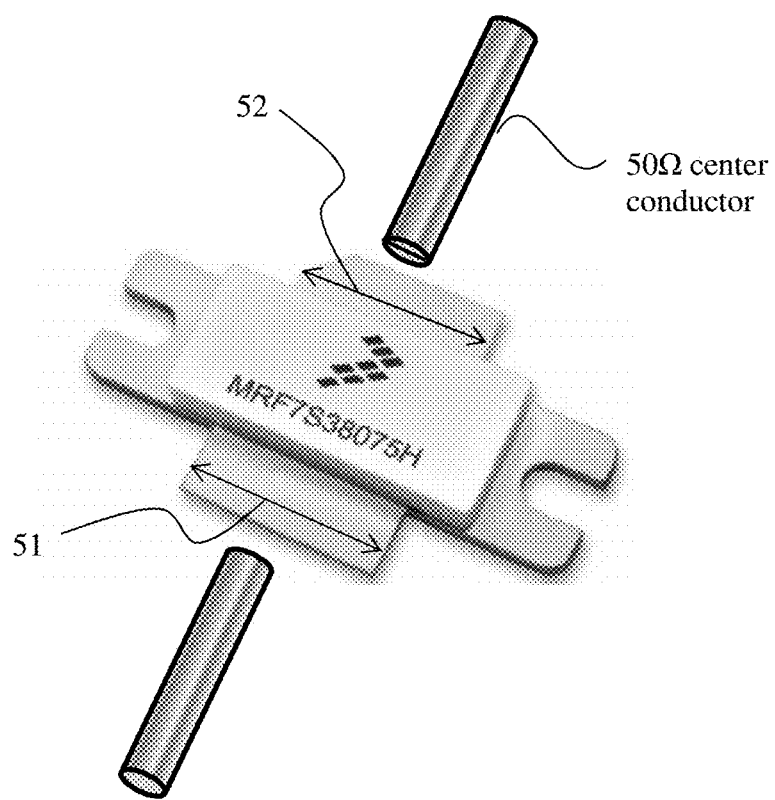
FIG. 5: Prior art

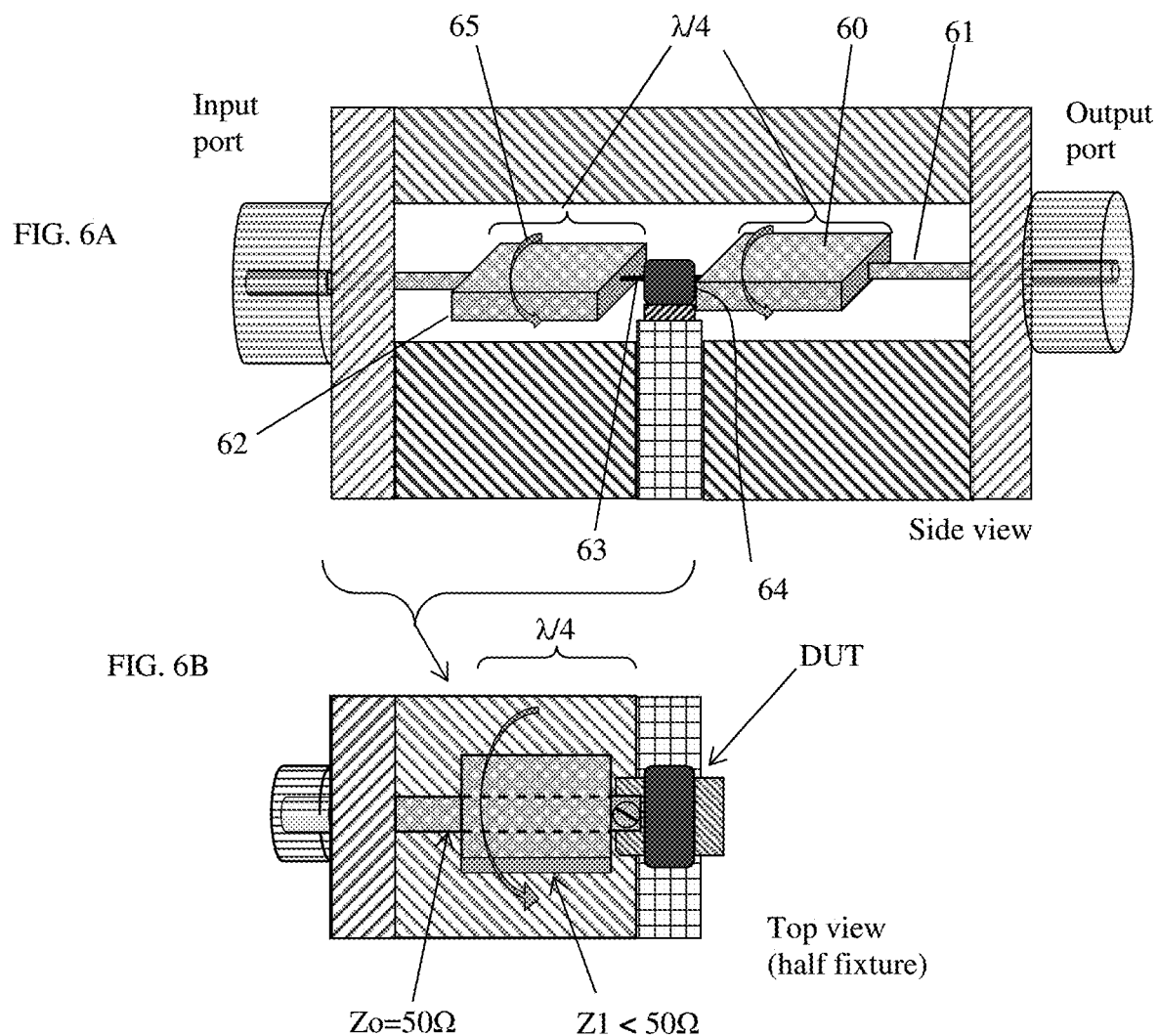

ADJUSTABLE PRE-MATCHING COAXIAL TRANSISTOR TEST FIXTURE

PRIORITY CLAIM

This application claims priority on provisional application 62/436,132, titled: Coaxial Transistor Test Fixture With Variable Impedance, filed on Dec. 19, 2016.

CROSS-REFERENCE TO RELATED ARTICLES

1. TSIRONIS, U.S. Pat. No. 6,414,563, "Low-Loss Microwave Device Test Fixture with Adjustable Blocks"
2. "Test Fixture for Medium and High Power RF Transistors", Product Note 7, Focus Microwaves, January 1994
3. "Load Pull", [online], Wikipedia [Retrieved on Nov. 18, 2016] Retrieved from Internet <URL: http://en.wikipedia.org/wiki/Load_pull>.
4. "GaN RF Power Transistor" QPD2795 Data sheet, [online], Triquint/Qorvo, [Retrieved on Dec. 7, 2016] Retrieved from Internet <URL: http://www.qorvo.com/products/p/QPD2795>.
5. "EEsof EDA Advanced System Designs" Brochure 5988-3326EN, Keysight Technologies, Dec. 30, 2014.

BACKGROUND OF THE INVENTION

This invention relates to transistor test fixtures used in testing RF transistors in microwave frequencies (see ref. 1, 2). Active RF components (transistors—DUT) need to be thoroughly tested at the operation frequencies before used in amplifier and other circuit designs. "Load pull" and "Source pull" (see ref. 3) are test methods which use impedance tuners to systematically characterize the DUTs under various load and source impedance conditions. Load pull or source pull are automated measurement techniques used to measure Gain, Power, Efficiency and other characteristics of the DUT, employing, beyond source and load impedance tuners, also other test equipment, such as signal sources, directional couplers, test fixtures to house the DUT and input and output power meters (FIG. 1), see ref. 3. Typical test fixtures (see ref. 2) are based on micro-strip structure (FIG. 2). As can be seen in FIG. 1, the DUT is housed in the test fixture; the test fixture establishes RF connection between the DUT terminals and coaxial connectors, which allow access to and from external instruments (FIGS. 2, 4 and 5).

Microstrip test fixtures (FIG. 2A, 2B) include grounded input (22, 213) and output (28, 215) body sections, and a DUT INSERT (214). The DUT (210) is mounted on the INSERT (214) using screws (26) or other securing mechanism. The fixture has input (20) and output (27) connectors and microstrip lines (29, 212) between the connectors. The microstrip lines comprise a dielectric layer on which a thin copper conductor layer is etched using photolithographic process. The DUT (210) package has leads (24, 211, 51, 52) which can be soldered or pressed on the microstrip (29, 212), see also FIG. 5 and ref. 4.

High power transistors have very low input and output impedance $Z_{DUT}=R_{DUT}+jX_{DUT}$, with $R_{DUT}$ of the order of 1 to 3Ω. For proper load pull testing, the tuners must match these impedances (i.e. create impedances $R_{TUNER}=R_{DUT}$, and $X_{TUNER}=-X_{DUT}$). However the tuning range of the tuners (i.e. the minimum $R_{TUNER}$ that can be reached) is reduced by the insertion loss of the test fixture; therefore there is requirement for extremely low loss test fixtures. Most existing microstrip fixtures (FIG. 2) have non-negligible insertion loss due to the used dielectric material on which the microstrip lines (29, 212) are etched photo lithographically. Since air has the lowest insertion loss of any transmission media, it is logical to make and use in a test fixture coaxial airlines, instead of micro-strip, as long as it can be technically made. In 2000/2002 such a fixture was disclosed (see ref. 1). However this fixture has 50Ω transmission airlines (31, 47, 48) which are not the optimum solution for matching low impedance targets (DUT), both from RF reflection and from mechanical points of view; as shown in FIG. 5 the transistor leads (51, 52) are wide and should also be mechanically matched to the adjoining center conductors. It is clear from FIG. 5 that the 50Ω center conductor does not match mechanically the transistor leads.

BRIEF DESCRIPTION OF THE INVENTION

This invention utilizes the fact that the axial orientation (rotation) of a non-cylindrical transforming section of the center conductor in an airline or slabline affects the characteristic impedance. Based on this fact the invention discloses a new embodiment of a coaxial fixture, whereby the transmission airline has an adjustable characteristic impedance Z1 lower or larger than 50Ω; in fact by widening the center conductor (47, 48), or forming a parallelepiped block, one can reach Z1<50Ω or, by narrowing it, one can reach Z1>50Ω, depending on the internal impedance of the DUT to match. In the present embodiment we concentrate on "lowering" and being able to "adjust in situ" (i.e. without disassembling) the characteristic impedance Z. The general rule applies that, when a λ/4 long transmission line section with a characteristic impedance Z1 is attached to a transmission line with a characteristic impedance Zo (typically 50Ω), which is terminated with Zo, then on the other side of the transmission line with characteristic impedance Z1 one sees $Z2=Z1^2/Zo$. As an example: if Z2 shall be equal to 10Ω (Z2=10Ω), then the transforming section must have a characteristic impedance of Z1=22.36Ω. In this invention, other than in any prior art, the characteristic impedance Z1 is adjustable, by rotating the transforming segment around the transmission line axis, it becomes Z1(Φ), whereby Φ is the rotation angle (FIG. 7B). This leads to a pre-matching test fixture with adjustable impedance transforming ratio Z2:Zo.

BRIEF DESCRIPTION OF THE DRAWINGS

The invention and its mode of operation will be better understood from the following detailed description when read with the appended drawings in which:

FIG. 1 depicts prior art, a traditional load pull measurement setup.

FIGS. 2A through 2B depict prior art; FIG. 2A depicts top view of a micro-strip transistor test fixture; FIG. 2B depicts side view of the micro-strip transistor test fixture;

FIG. 3 depicts prior art, a 3D view of coaxial 50Ω test fixture;

FIGS. 4A through 4B depict prior art; FIG. 4A depicts side view of 50Ω coaxial test fixture; FIG. 4B depicts front view of cross section "A-B" of 50Ω coaxial test fixture.

FIG. 5 depicts prior art, a packaged RF power transistor and 50Ω center conductors of a slabline or coaxial airline.

FIGS. 6A through 6B depict a pre-matched coaxial test fixture using quarter lambda (λ/4) transformer sections that can be rotated around the axis of the central conductor of the airline; FIG. 6A depicts a side view, FIG. 6B depicts a top view of the left section of the fixture of FIG. 6A.

FIG. 7A depicts a side view with left transformer lateral (0°) and right transformer vertical (90°); FIG. 7B depicts a cross section A-B view and three rotation angles of the transforming section.

FIG. 12A depicts 3D view and FIG. 12B cross section of transforming segment with elliptical cross section rotated by approximately 45°. The concept is extendable to multi-segment transformers.

FIG. 14A depicts the "normal" un-rotated state, FIG. 14B depicts an approximately 45° rotated state and FIG. 14C depicts a quasi-vertical (>80°) rotation state.

DETAILED DESCRIPTION OF THE INVENTION

Figures 7A, 7B:
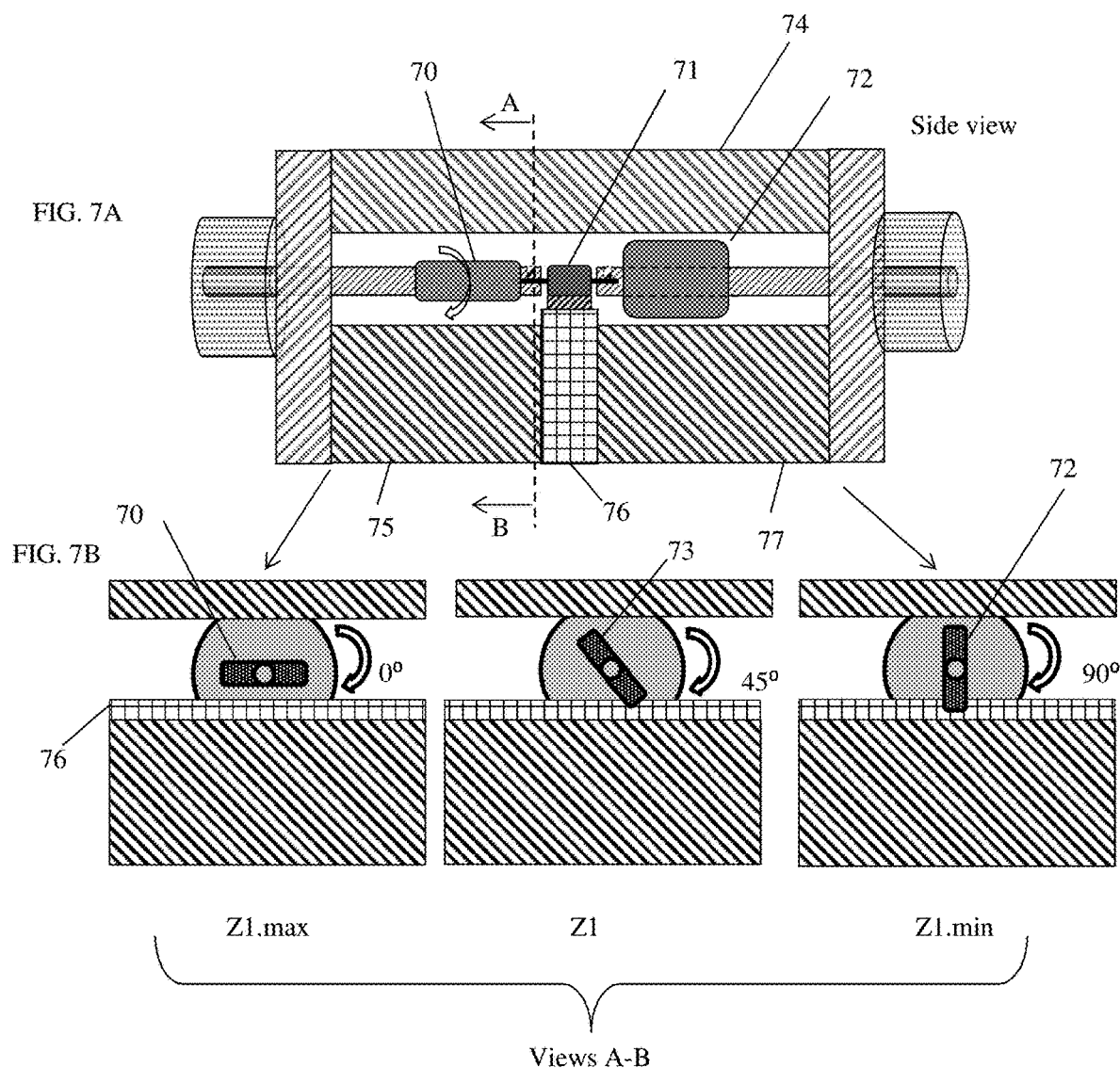
FIGS. 7A through 7B depict a pre-matched coaxial test fixture using λ/4 transformer sections and possible angle rotation states.

FIGS. 3 and 4 show the prior art coaxial transistor test fixture (see ref. 1). Two coaxial connectors (40, 42) are attached to vertical walls (413) and the extensions of the center conductors of said connectors (31, 47, 48) form with the two blocks (25, 49) and the cover (11, 46) an open transmission line (slabline), which is interrupted in the center to allow inserting a block (21, 44), referred hitherto as "INSERT", which carries the packaged DUT (43). In this case the transistor package (43) is placed on the INSERT (44), which is part of the horizontal slabline structure formed of the two ground planes (46, 49) and the center conductor (47, 48). The signal enters in the input port (40) and leaves at the output port (42) and is being conducted to the transistor by the two coaxial center conductor segments (47, 48). The transistor leads (41) are inserted and firmly secured into horizontal slots (411) of the center conductors. The test fixture INSERT (44, 410) secures the transistor package (43, 45) with two screws (412) for good RF grounding and heat dissipation. The advantage of this type of test fixture is lower insertion loss between the transistor leads (41) and the input (40) and output (42) ports and, by consequence, allowance for higher tuning range by the tuners.

In a first embodiment of a pre-matching coaxial test fixture with variable characteristic impedance the impedance transformers are quarter wavelength (λ/4) sections of center conductor, creating characteristic impedance between Z1.min and Z1.max in all cases lower than the Zo=50Ω characteristic impedance of the slabline. These sections can be elliptical or parallelepiped, as long as electromagnetic analysis (see ref. 5) determines the correct dimensions. Typically, in a 20 mm wide slabline structure, a cylindrical center conductor of 11 mm diameter creates Zo=50.3Ω and a center conductor of 17 mm diameter a characteristic impedance of 24.2Ω. A rectangular center conductor of 17 mm width and 5 mm thickness creates a Zo of 50.6Ω and a 13 mm×7 mm center conductor a Zo of 21Ω in the same slabline. It is therefore possible to adjust the characteristic impedance of the transforming sections to electrically match the DUT impedance and to mechanically match the width of the package leads (51, 52) as well. Further on, by rotating the non-cylindrical transformer segment axially one can modify the characteristic impedance without changing the basic structure and dimensions of the fixture.

As an embodiment (FIGS. 6 and 7) a parallelepiped transforming segment having length of λ/4 at the operation frequency and having a width of 17 mm and a thickness of 8 m, is integrated as part of the transmission line, inside a slabline of 20 mm channel width; when adjusted "flat", i.e. with the wide side parallel to the slabline walls (Φ=0°) it creates a characteristic impedance of 40.212; if the same transformer segment is rotated and adjusted vertically (Φ=90°) then the characteristic impedance becomes 17.6Ω. This shows that by simply rotating the transforming segment, without any other intervention into the structure of the fixture, one can modify Z1 by a factor of at approximately 2.5. Translated into impedance Zx, presented to the DUT, one may expect control of Zx between Zx=32Ω and Zx=6.2Ω, an impedance transforming ratio of over 5:1. This is because $Zx=Z1^2/Zo$, with Zo=50Ω.

Details of this operation are shown in FIG. 6: The transforming segments (60, 62) rotate around the center conductor (61), which may traverse the segment, reach and be attached to (63) the DUT (64). Nominal impedance transforming occurs at the frequency where the transforming segment is quarter of wavelength long (λ/4). The segments (60) and (62) can be rotated together or individually. This means that the impedances presented at each port of the DUT can be independently adjusted, as discussed before.

Further details and possible transformer settings are shown in FIGS. 7A and 7B. Transforming λ/4 segment (70) lies flat (Φ=0°), generating maximum characteristic impedance Z1.max, whereas segment (72) lies vertically (Φ=90°) and generates minimum characteristic impedance Z1.min. Segment position (73) lies between 0° and 90° and generates characteristic impedance Z1, whereby Z1.min<Z1<Z1.max, thus allowing a wide variety of impedances to be presented to the DUT (71).

Figure 8:
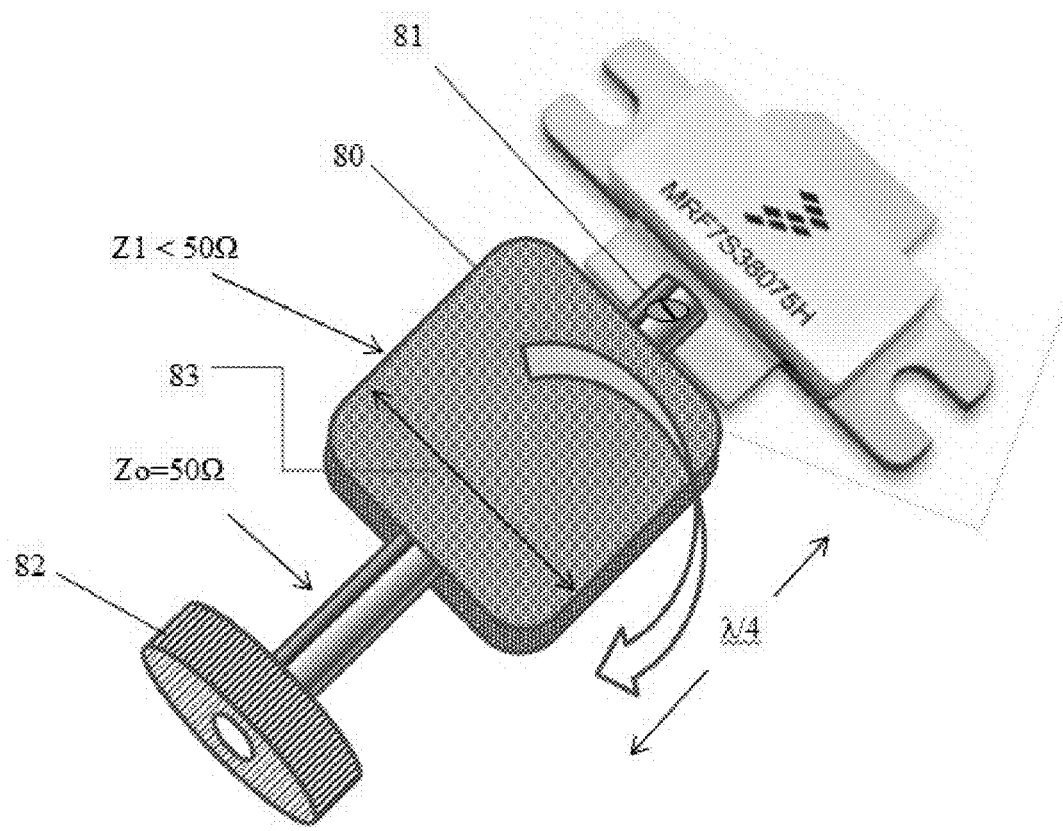
FIG. 8 depicts 3D view of mounting the packaged transistor of FIG. 5 in the fixture and the rotation mechanism of the λ/4 transformer section around the central conductor of the airline, shown in FIG. 7.

A representative view in 3D of a quarter wavelength transforming segment (80) able to rotate is shown in FIG. 8. The segment has a width (83) and is mounted on the center conductor (81) which holds the lead of the transistor. The other end of the center conductor is attached on the coaxial connector (82). By rotating the segment (80) one can adjust its characteristic impedance in the slabline.

Figure 9:
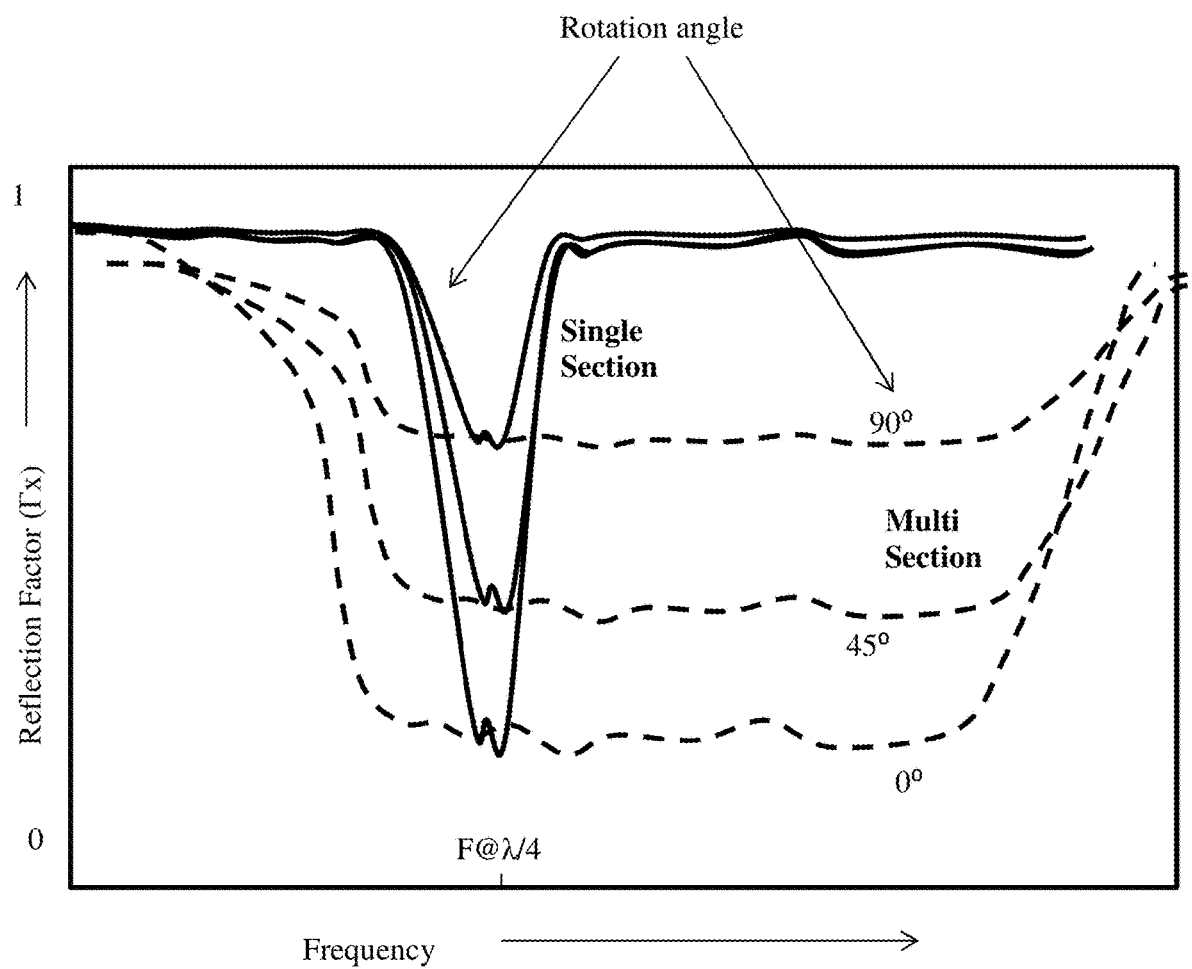
FIG. 9 depicts the frequency response of the reflection factor of the pre-matching sections of the test fixture when terminated with the low internal impedance of the DUT at various rotation angles between 0° (lateral) and 90° (vertical), when using single quarter wavelength transformer and multi-section wideband transformer.
Figure 10:
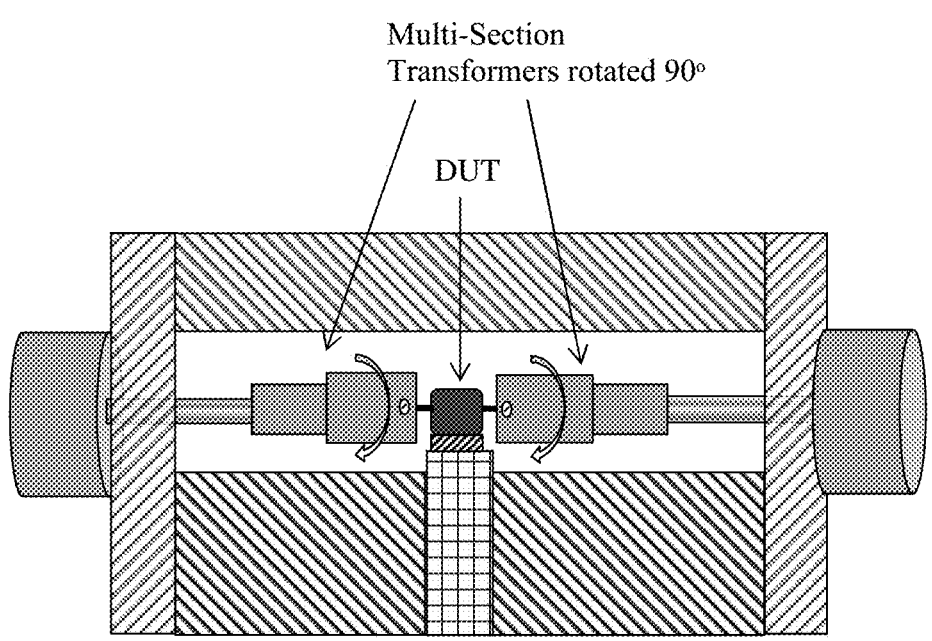
FIG. 10 depicts rotating two-segment transformers of coaxial test fixture with decreasing characteristic impedances towards the DUT, the segments shown rotated at 90°.
Figure 11:
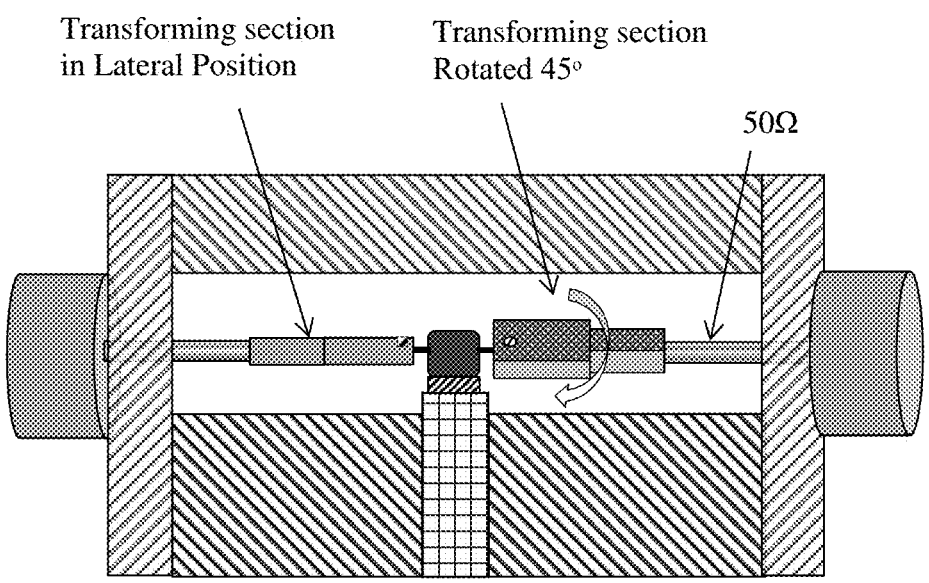
FIG. 11 depicts rotating multi-segment transformers of coaxial test fixture with decreasing characteristic impedances towards the DUT, the left segment lateral and the right segment rotated by approximately 45°.

The frequency response of single and multiple section transformers is shown in FIG. 9. Multiple sections allow wider bandwidth whereas single sections resonate at the λ/4 frequency. The Reflection Factor (Γx) is related to the target impedance Zx, to be presented to the DUT. If this impedance is Zx then Γx is defined as: Γx=(Z−Zx)/(Z+Zx), whereby Z is the actual impedance presented by the transforming fixture to the DUT (i.e. if the generated impedance Z is equal to the target Zx then Γx=0). Using single stage λ/4 transformers is narrowband; it works best at the specific frequency F in gigahertz, F (GHz)=75/L (mm), whereby L is the length in millimeters of the transforming section along the transmission line axis. In order to increase the effective bandwidth one has to use multiple transforming sections with decreasing characteristic impedance from the 50Ω center conductor to the DUT terminals (FIGS. 10 and 11). Rotating the multi-step transformers has a similar effect as rotating a single step (FIG. 9). In FIG. 11 each transforming section is rotated differently having similar effect, albeit larger bandwidth, as the operation in FIGS. 7A and 7B.

Figure 12A:
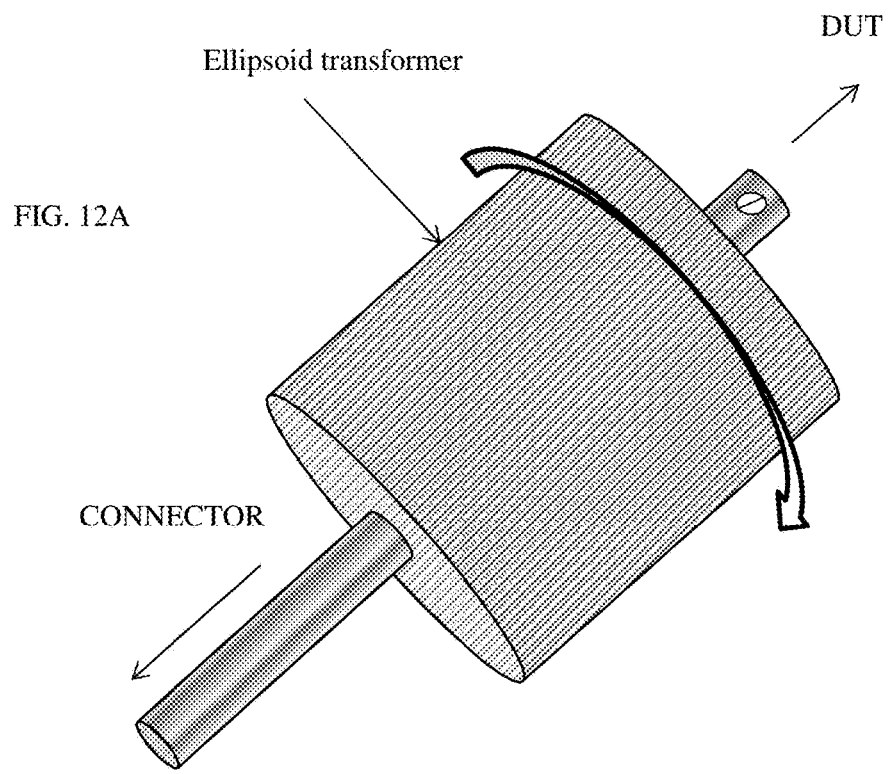
FIGS. 12A through 12B depict views of ellipsoidal transforming segment.
Figure 12B:
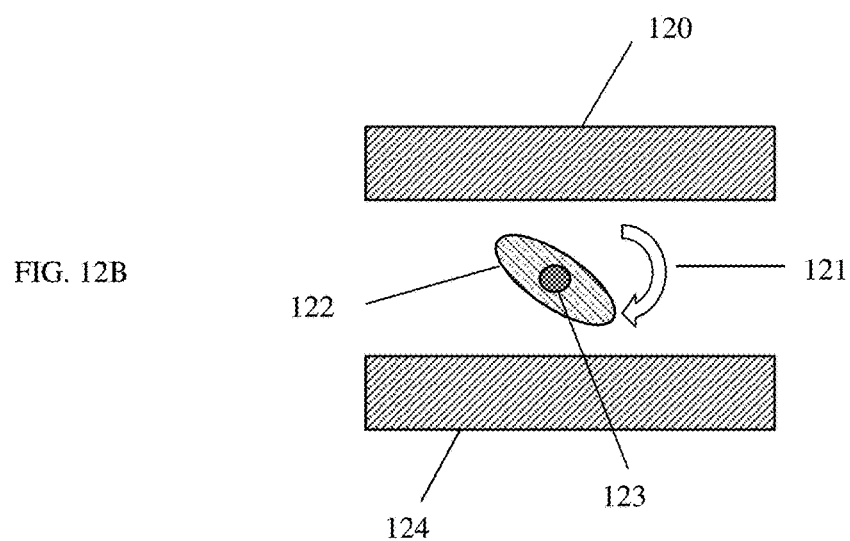

Finally the cross section of the transforming segments does not have to be rectangular only. In a further embodiment (FIGS. 12A and 12B) it is shown that it can be ellipsoid as well. FIG. 12A shows a 3D view of ellipsoid transforming segment mounted on the center conductor between DUT and connector. FIG. 12B shows the various possible states (angles, (121)) at which the segment (122) can be rotated around the center conductor (123) mounted between the top (120) and bottom (124) ground planes of the fixture body (slabline).

Figure 13:
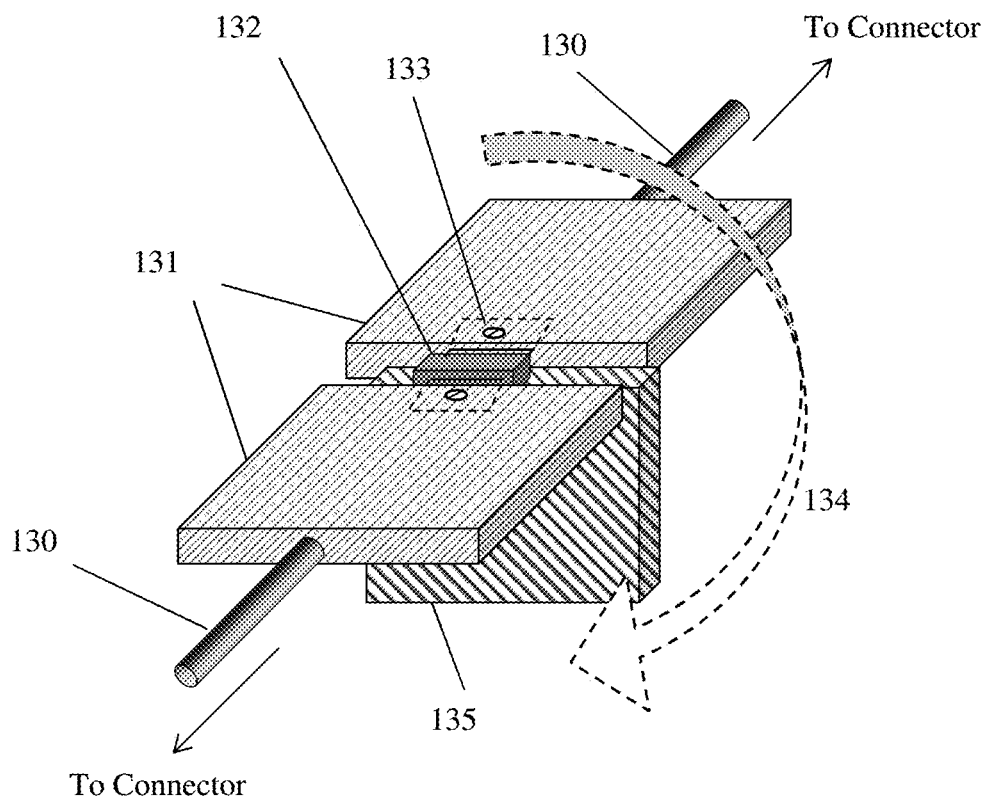
FIG. 13 depicts the entirely assembly of transforming segments, DUT and INSERT rotating as a single unit.

FIG. 13 shows an alternative embodiment of the invention. In-order to eliminate spurious reflections and mismatching at the joint between rotating transforming segments and DUT (81) the DUT (132) is mounted directly on the transforming segments using securing screws (133) and rotates (134) together with the INSERT (135) and the transforming segments (131) around the center conductors (130). In view of the fact that the range of rotation is between 0 and maximum 90 degrees, this embodiment is feasible if the INSERT (135) is narrow enough, in-order not to conflict with the top cover (120, 140) of the fixture, since the top cover (74), in FIG. 7, is continuous from connector (40) to connector (42), whereas the bottom two blocks of the fixture (75, 77) are separated at the location of the INSERT (76) and allow the properly dimensioned INSERT (135) to rotate (134) together with the DUT (132) permanently secured on the transforming segments (131) and the INSERT (135).

Figure 14:
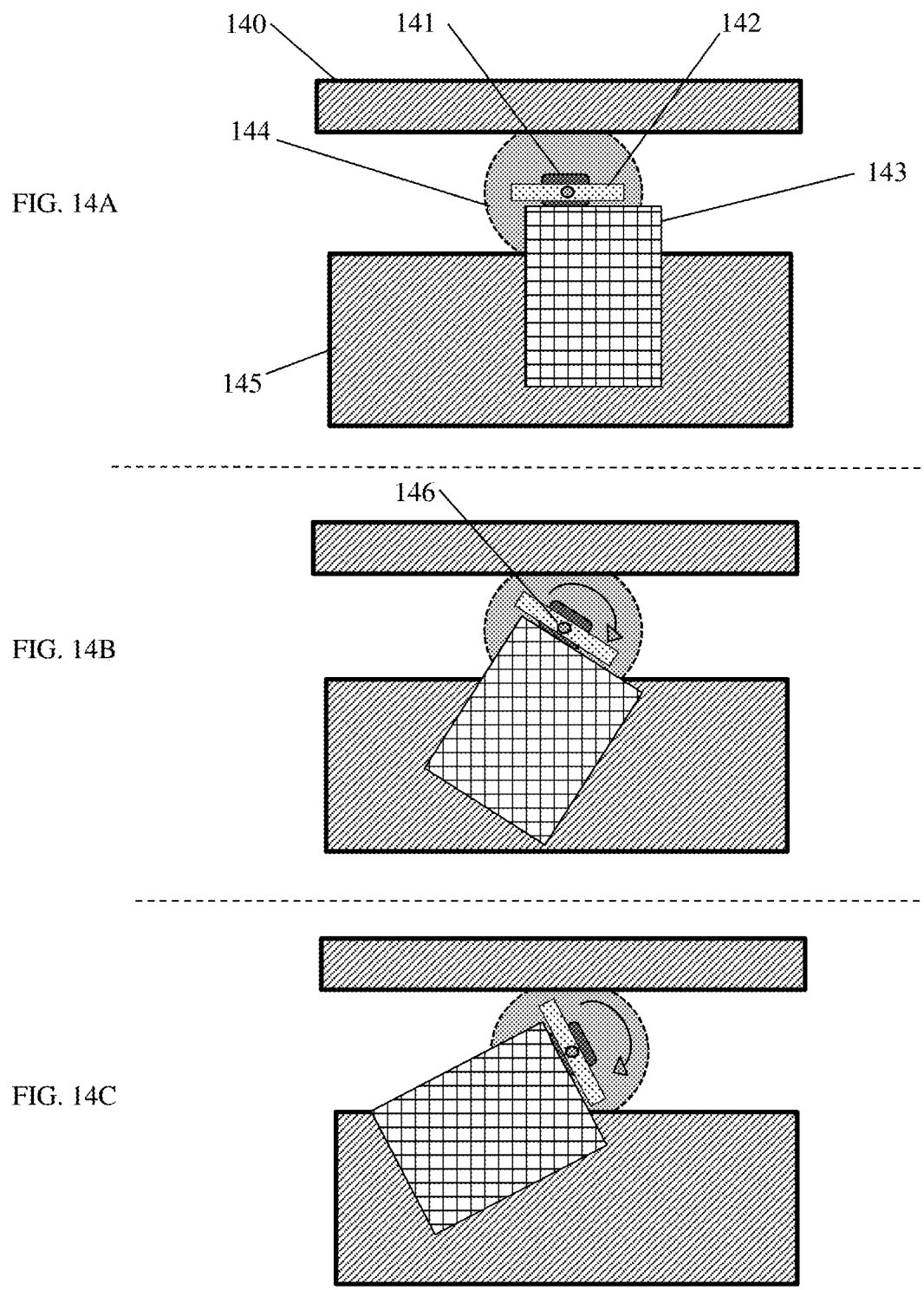
FIGS. 14A through 14C depict three possible states of the assembly composed of the INSERT carrying the DUT which is attached to the transforming segments, rotated around the axis of the center conductor of the airline.
Figure 15:
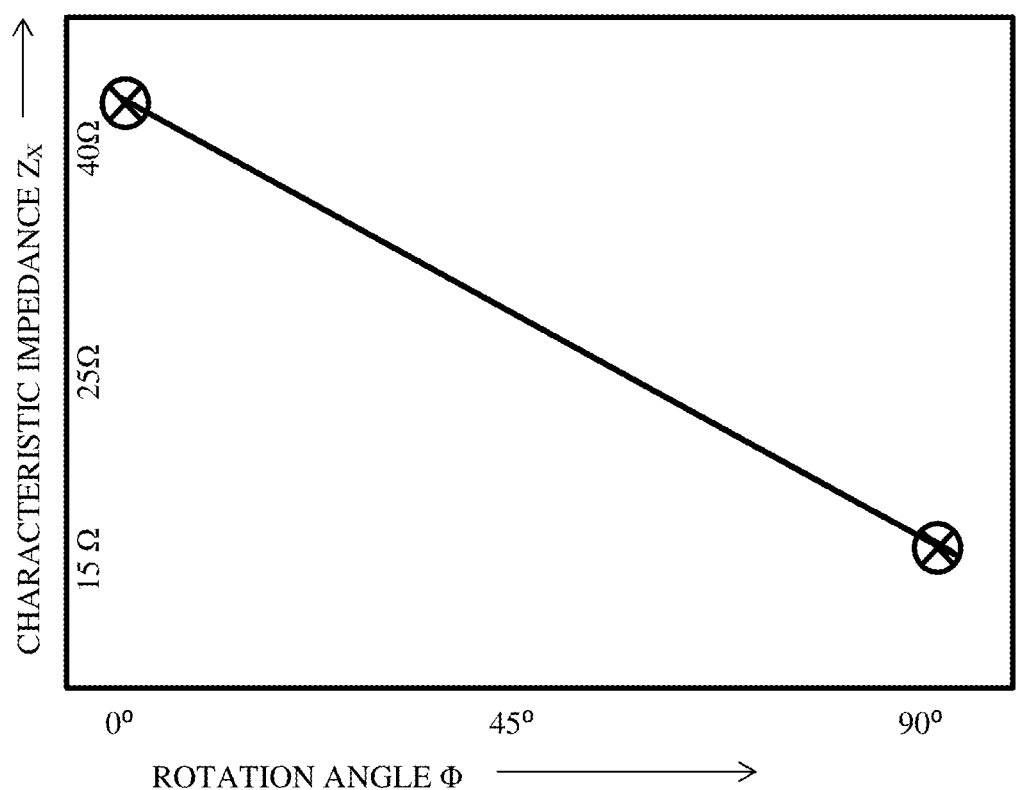
FIG. 15 depicts the approximate dependence of the characteristic impedance $Z_X$ of a parallelepiped pre-matching section (FIG. 6) of center conductor in a slabline when rotated axially between 0° (wide side parallel to slabline walls) and 90° (wide side perpendicular to slabline walls).

FIG. 14 depicts three rotation states of the assembly composed of DUT (141), INSERT (143) and transforming segments (142). The assembly rotates around the center conductor (146) and is enveloped between the cover (140) and the two ground blocks (145) of the fixture, of which only the one behind the INSERT (143) is shown (77) in FIG. 7A in the view A-B as well the "hidden" contour of the coaxial connector (144). In order to accommodate the rotation restraints, the INSERT (135) in FIG. 13 and (143) in FIG. 14 is shown to be unsymmetrical relative to the DUT (132, 141), i.e. it extends more to one side than the other. This does not affect the behavior of the fixture, as long as the created gap between the ground blocks (75) and (77) is not affecting the grounding of the DUT. FIG. 15 depicts the two extremes and the approximate dependence of characteristic impedance of the prematching section on rotation angle.

Although the present invention has been explained hereinabove by way of three preferred embodiments, it should be pointed out that other combinations of the described components are possible and, as far as obvious to a person skilled in the art, they shall not limit the scope of the present invention.

What I claim as my invention is:

1. A coaxial pre-matching RF transistor (DUT) test fixture having an adjustable impedance transforming ratio comprising:
   an input section attached to an input port,
   an output section attached to an output port,
   a metallic block disposed between the input and output sections for carrying the DUT, and
   a metallic cover extending from the input port to the output port, wherein the input section and the output section each comprise:
   a bottom metallic block,
   a coaxial connector associated with the corresponding port, and
   a center conductor attached to the connector and extending from the connector to the metallic block within a space defined by the metallic cover and the bottom metallic block, the center conductor forming a lateral slabline; wherein the center conductor of the slabline in each of the input and output sections comprises a 50Ω segment and at least one non-50Ω segment, wherein the at least one non-50Ω segment is disposed between the at least one 50Ω segment and the DUT and is axially rotatable around the center conductor of the slabline, and wherein each of the at least one non-50Ω segments, the DUT and the metallic block are secured as a single assembly that is rotatable as a single unit around the center conductor of the slabline.

2. The test fixture of claim 1, wherein a length of the at least one non-50Ω segment is one quarter wavelength at an operation frequency.

3. The test fixture of claim 1, wherein at least one non-50Ω segment comprises a number N>1 of cascaded segments 1, 2 . . . N with characteristic impedances Z1, Z2, . . . ZN, whereby segment 1 is attached to the 50Ω segment and segment N is attached to the DUT, and wherein 50Ω>Z1>Z2 . . . >ZN,
   and wherein a length of the segments is optimized for maximum frequency bandwidth.

4. The test fixture of claim 1 or 3, wherein at least one non-50Ω segment is a parallelepiped block.

5. The test fixture of claim 1 or 3, wherein at least one non-50Ω segment is a co-axial ellipsoid.

6. The test fixture of claim 1, wherein at least one non-50Ω segment is exchangeable.

* * * * *